VAPOR POLISHING OF A SEMICONDUCTOR WAFER
Filed Aug. 12, 1964
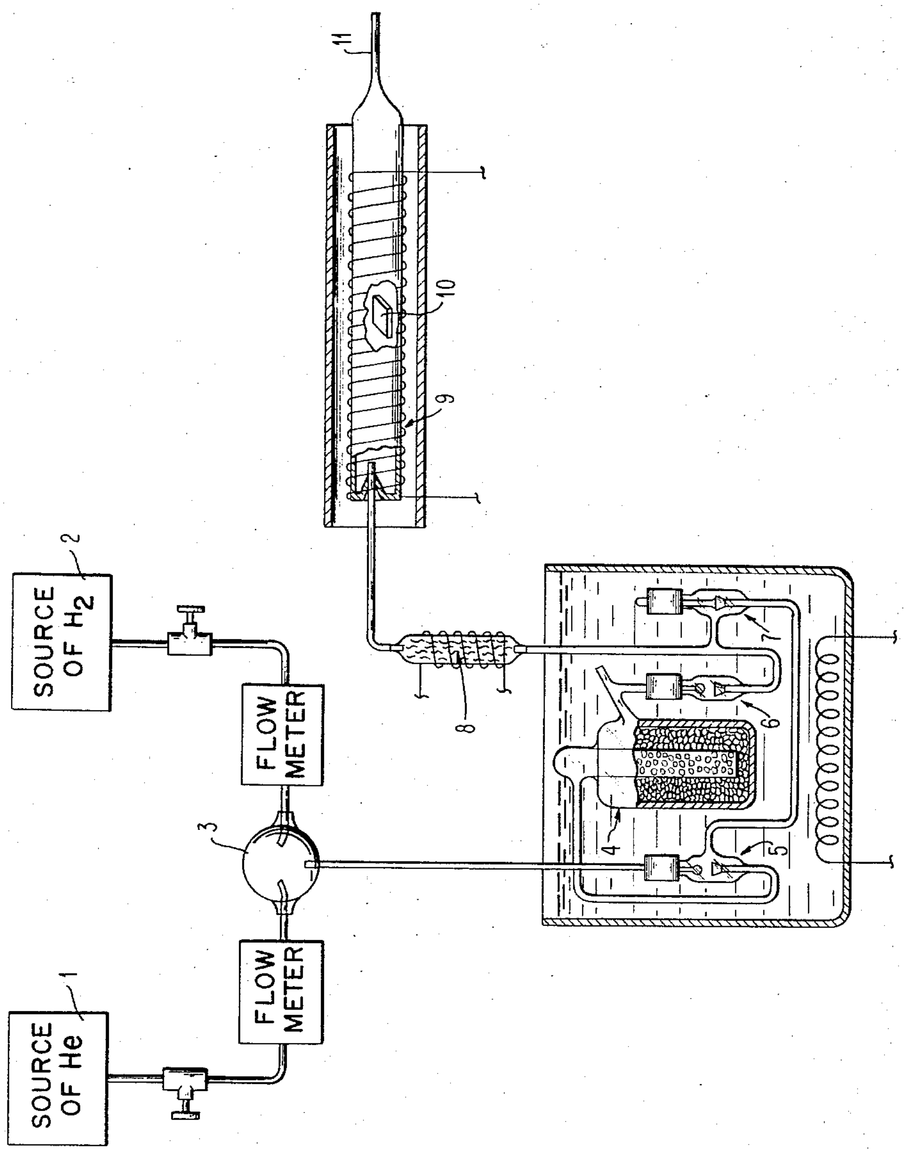
INVENTORS
MELVIN BERKENBLIT
ARNOLD REISMAN
BY
Allen A. Meyer
ATTORNEY

United States Patent Office 3,366,520

Patented Jan. 30, 1968

3,366,520

VAPOR POLISHING OF A SEMICONDUCTOR WAFER

Melvin Berkenblit and Arnold Reisman, Yorktown Heights, N.Y., assignors to International Business Machines Corporation, New York, N.Y., a corporation of New York Filed Aug. 12, 1964, Ser. No. 389,017
15 Claims. (Cl. 156—17)

This invention relates to the vapor polishing of semiconductor surfaces and more particularly enables the polishing of germanium and silicon surfaces by means of hydrogen iodide generated in situ to produce a clean mirror smooth damage free surface.

The preparation of clean mirror smooth damage free surfaces of germanium and silicon or other semiconductor materials is very important when these surfaces are to be used subsequently for the epitaxial deposition of semiconductor materials such as germanium, silicon, gallium arsenide, etc, in which structures are fabricated directly on the surfaces in question. In order to minimize defects in the epitaxial layers, it is essential to remove any oxide or other formed deposits as well as any mechanically worked region resulting from the sawing, lapping and polishing of the surface.

Mechanical cutting, lapping and polishing of the substrate surfaces introduce extensive damage to the surface, and the bulk of the substrate to be used for the epitaxial deposition. Chemical solution polishing techniques, while eliminating the surface damage, require that the samples be exposed to ambient or other intermediate atmospheres subsequent to polishing and prior to vapor deposition. In general such polishing procedures also leave surface films on the substrate. Both fine pits and orange peel can usually be observed on such chemically polished silicon wafers, even when the rotating beaker techniques of polishing is employed. In addition the wafers are covered by a haze. Vapor polishing techniques using hydrogen chloride, while frequently valuable, are not consistent in their results due to the variability of available gaseous hydrogen chloride. In the case of silicon, furthermore, HCl has not been found to be a usable polishing technique when starting with lapped surfaces. In general mechanically polished wafers must be used as a starting point for the hydrogen chloride technique.

The process of the invention pertains to the vapor polishing of a semiconductor substrate material such as, for example, germanium and silicon to produce a clean mirror smooth damage free surface starting with either lapped, mechanically polished or chemically polished substrates. This vapor polishing is accomplished by means of hydrogen iodide generated in situ and carried in pure hydrogen, helium or a hydrogen-helium mixture. These polished surfaces are then used as substrates for the epitaxial deposition of semiconductors in order to fabricate planar transistor or diode structures or heterojunction devices which are used in computer mechanisms or other electronic applications.

It is an object of the invention to prepare clean, mirror smooth damage free surfaces of a single crystal semiconductor wafer.

It is another object of the invention to vapor phase polish single crystal semiconductor wafers of germanium and silicon.

It is still another object of the invention to vapor phase polish single crystal semiconductor wafers of silicon and germanium with a gaseous mixture containing hydrogen iodide.

It is a further object of the invention to vapor phase polish single crystal semiconductor wafers of germanium and silicon with a gaseous mixture of hydrogen iodide-hydrogen.

It is still a further object of the invention to vapor phase polish single crystal semiconductor wafers of germanium and silicon with a gaseous mixture or hydrogen iodide-helium.

It is still another object of the invention to vapor phase polish single crystal semiconductor wafers of germanium and silicon with a gaseous mixture of hydrogen iodide-hydrogen-helium.

Another object of the invention is to start with lapped single crystal semiconductor wafers and remove the damaged area and induce a polish in order to prepare clean, mirror smooth, damage free surfaces.

A further object of the invention is the vapor phase polishing of single crystal chemically polished semiconductor wafers to remove the damaged area and retain the existing polish.

Still a further object of the invention is to vapor phase polish mechanically polished single crystal semiconductor wafers to remove the damaged area and retain the existing polish.

Another object of the invention is to define the conditions for vapor polishing lapped, chemically or mechanically polished semiconductor wafers so that the rate of removal from the surface can be critically controlled and is not affected by variations in the temperature of etching and velocity with which the gas etching stream passes over the surface of the wafer.

The foregoing and other objects, features and advantages of the invention will be apparent from the following more particular description of preferred embodiments of the invention, as illustrated in the accompanying drawing:

The figure is a schematic representation of the apparatus used in the vapor polishing of the surfaces of the germanium and silicon wafers.

The process of the invention provides a method for achieving clean mirror smooth damage free surfaces on germanium and silicon single crystal wafers starting with lapped, mechanically or chemically polished wafers, by treating said wafers in a flowing gaseous mixture comprised of hydrogen iodide, and a gas selected from the group consisting of hydrogen, helium and mixtures thereof under specified conditions of temperature, linear velocity of the flowing gas stream and partial pressure of hydrogen iodide.

The vapor phase polishing process of the invention with respect to germanium and silicon single crystal wafers involves the following sequence of generalized steps:

Single crystal wafers of germanium or silicon of desired crystallographic orientation, for example, (111), (110), (100), (211), etc., conductivity type, for example n or p, and impurity concentration, for example, approximately $1\times10^{15}$ to approximately $1\times10^{19}$ impurity atoms per cubic centimeter are cut from single crystal ingots using diamond or other suitable saws. These wafers are then lapped to a uniform thickness on a lapping wheel using aluminum oxide, diamond or other suitable lapping grit. At this point the process may follow one of three paths, that is, the lapped wafer may be subjected to the process of the invention, the lapped wafer may be mechanically polished then subjected to the process of the invention, or the lapped wafer may be chemically polished then subjected to the process of the invention.

The choice of one of the above alternatives is determined primarily by convenience and to some extent by the degree of overall final wafer planarity required on the semiconductor material which is being polished. Thus, if one has available a rapid room temperature chemical polishing technique by which most of the surface damage can be removed, and which does not cause excessive wafer rounding, the vapor polishing technique is best used to retain the polish achieved by the solution polishing and to clean the surface of any contamination. For example, the chemical polishing technique procedure set forth in U.S. application S.N. 356,793 entitled, "Chemical Polishing of a Substrate" (inventors: A. Reisman and R. L. Rohr) is very effective for germanium in providing initially polished damage free surfaces as a starting point for the process of the present invention. Mechanically polished surfaces of germanium are also useful starting points, but because of the damage induced, mechanical polishing techniques are not as preferable since the vapor polish must be run for longer periods of time to remove this damage. With silicon, chemical polishing techniques generally result in highly rounded wafers to start with, and the process of the present invention cannot undo this rounding. It is preferable in the case of Si, therefore, to use as a starting point lapped Si wafers. Although longer vapor phase polishing times must be employed, the resulting product does not exhibit excessive edge rounding.

To vapor phase polish a germanium single crystal semiconductor wafer, the process of the invention involves the use of hydrogen iodide with a gas such as hydrogen, helium or a mixture of hydrogen and helium to etch the germanium. The hydrogen iodide may be generated in situ by an apparatus similar to that disclosed in application S.N. 356,850 entitled, "Growth Control of Disproportionation Process" (inventors: G. Cheroff and A. Reisman) and as previously stated may be mixed with hydrogen, helium or a mixture of hydrogen and helium.

The partial pressure of HI in such a mixture, depending on the microscopic attributes of the polished wafer must be maintained below some critical value for two reasons:

(1) Above this critical value, microscopic pitting begins to occur and (2) Above this critical value, a slight variation in etching temperature will cause a large variation in etching rate while below this critical value, a large variation in etching temperature will cause only a slight variation in etching rate which is a highly desirable attribute of such a process. Below this critical concentration value, the quality of the polish and the insensitivity of etch rate with etch temperature is retained. However, even though lower values than the critical value may be employed, it is advantageous from a practical standpoint to conduct the vapor phase polishing with values of the HI partial pressure around the critical value so that maximum etch rates consistent with high quality polishes being obtained are achieved.

The vapor phase polishing is conducted at a temperature of from 890° C. to 920° C. for germanium with the preferred temperature being 910° C. The hydrogen iodide partial pressure may generally range from 1–150 mm. of mercury pressure with the preferred range being from 16–70 mm. of mercury pressure. The linear velocity of the HI carrier gas mixture may range from 1 to 10,000 cm. per minute or more with equally good polishes resulting, however, if the linear gas stream velocity is too low one will observe large variations in etching rate with small variations in the linear gas stream velocity. Above some critical range however, one will observe only slight variations in etch rate with large variations in linear velocity. In addition, as the etch rate is greater at high linear velocities, it is of practical advantage to operate at high linear velocities. The preferred linear velocity range for Ge is 700 cm. per minute or more although as pointed out above, equally satisfactory polishes result below this value. Velocities below 300 cm. per minute are not recommended because the effects of variation of etch rate with variation in linear velocity become large.

For the Si semiconductor single crystal wafers, it has been found that the following conditions are operable:

The vapor phase polishing mixture used in the polishing of silicon single crystal semiconductor wafers again is hydrogen iodide and a gas selected from the group consisting of hydrogen, helium and mixtures of hydrogen and helium. The temperature used may range from 1200 to 1300° C. with the preferred operating conditions at from 1220° C. to 1250° C. The hydrogen iodide partial pressure should be maintained at from 1–150 mm. of mercury pressure with a preferred range of from 16–70 mm. of mercury.

The linear gas velocity of the gas mixture passing over the surface of the single crystal semiconductor wafer is again from 1–10,000 or more cm./min., the preferred rate being 1000 cm./min., or more. The time required to achieve high quality polishing of either Ge or Si will depend on whether lapped, mechanically polished or chemically polished wafers have been used as starting point, the time required in general decreasing respectively in the order presented. This is because the damage is least in the chemically polished wafer and because less removal is required if one begins with a polished surface and only attempts to retain the polish while removing surface contamination and/or slight damage.

One further aspect of the process of the invention is significant. With all parameters such as HI partial pressure, linear gas streams velocity, and etching temperature constant, the etch rate increases with decreasing $H_2$ content of the carrier gas, thus, if pure $H_2$ is used as a carrier gas, the etch rate will only be 60% as great as when pure He is used as carrier gas. Since $H_2$ exhibits beneficial effects in the polishing situation in that it tends to reduce undesired oxide coatings on the semiconductor wafer, and since $H_2$ is generally obtainable in higher purities, than He, and since it is easier to control an apparatus using only a single carrier gas rather than a carrier gas comprised of a mixture, for practical reasons, the enhanced etching rate on pure He or $H_2$—He mixtures may be forsaken for the sake of simplicity of design of equipment. However, if enhanced etching rates are deemed important, the pure He or preferably a .2 mol fraction $H_2$+He mixture will provide comparable polishes to those obtained in pure $H_2$. The $H_2$—He mixture cited above is preferred over pure He since if the He contains slight amounts of $O_2$, the $H_2$ will prevent this $O_2$ from reacting with the semiconductor surface.

The effects of the variation of etching behavior of a substrate wafer as it relates to the achievement of smooth surface or the failure to do so as one varies the parameters, etching temperature, partial pressure of the etchant and the gas stream linear velocity may be best seen from the following discussion:

(*a*) *Effects of etching temperature*

Given an etchant such as hydrogen iodide in a certain concentration range, carried in a gas stream of fixed linear velocity, the specific reaction rate constant will in general increase with increasing temperature in accordance with known kinetic behavior. Keeping this in mind, two processes have to be considered. The first of these relates to the rate at which new etchant is brought to the vicinity of the wafer to be etched. This can be thought of as the etchant mass replenishment rate. The second relates to the rate at which the etchant in the vicinity of the wafer to be etched reacts with the surface of the wafer. The latter may be termed the surface reaction rate. If the surface to be polished is thought of as comprised of protrusions and depressions, it is evident that in an idealized polishing process the etchant will react only with protrusions to the complete exclusion of any reaction occurring in the depressions. In practice therefore, one must attempt to define conditions which most nearly approach this idealized situation. The situation is approached if the regions around the protrusion constitute active etching regions while the regions in the vicinity of the depressions constitute inactive or dead space areas. Since a wafer to be polished in a flowing gas stream is more likely to experience greater frequency of collision of arriving etchant vapor phase species with protrusions than with depressions, if the reaction rate can be made high enough so that the rate of reaction in a protrusion etchant collision is high, diffusion of etchant into depressions following initial collision with protrusions will be minimized. Since the factor that will affect this reaction speed most is the temperature, it is evident that for an etchant to be useful as a polishing agent, there has to be some temperature range in which the probability of reaction following collision exceeds the rate of etchant diffusion into depressions. If such a practical temperature range cannot be found in a particular etchant-semiconductor system, then a smooth polishing is not possible.

(*b*) *Effects of partial pressure of etchant*

Assuming that there exists a temperature range in which surface reaction rates are high enough, the effects of etchant concentration begin to play a role. Thus, at low etchant concentration the number of etchant particles striking unit areas of the protrusions are not so great that these areas are instantaneously swamped by too many etchant particles striking active sites per unit time relative to the specific reaction rate constant, and polishing will proceed smoothly. If, however, the etchant concentration becomes so great that the number of strikes (or collisions) per unit time approaches and exceeds the number of particles that can react in a given area per unit time, some of these particles will bounce from protrusions and diffuse into depressions. When such occurs, depressions will etch, and in fact certain orientations within depressions will etch faster giving rise in the final polished wafer to microscopic etch pits. The range of concentrations of etchants which will provide the highest quality polishes is that range, within the usable temperature range, in which the variation of etch rate at a particular concentration varies only slightly with temperature. When this state of affairs is fulfilled two beneficial results are obtained:

(i) the etching rate is essentially temperature independent and precise etching temperature control is not important; (ii) the maximum rate at which good polished quality results is achieved since the reaction to a good approximation is surface controlled.

(*c*) *Effects of linear gas stream velocity*

If in a given etchant apparatus one measures the rate of etching as a function of linear gas velocity at constant etching temperature and etching concentration, it is found that at low velocities the rate of etching varies markedly with velocity and that as one increases velocity the rate of etching begins to vary only slightly with increased velocity. In the latter range, an error in the setting of the velocity will not affect the etch rate to any great extent. Consequently, in order to achieve predictable etching rates it is beneficial to operate at velocities in which the etching rate is not greatly affected by the linear gas stream velocity. The quality of the polish itself is not affected by the rate of etching which changes with varying linear velocity, but the prediction of the quantities removed per unit time at higher velocities is more easily made in a practical situation.

The figure is a schematic representation of the apparatus used in the polishing process. All portions except heater wires are fabricated of fused quartz, although Pyrex may be employed excepting where elevated temperatures are employed. Helium from a source 1 or hydrogen from source 2 or a mixture of both passes through the mixing chamber. This gas is passed through a heated packed bed of iodine crystals 4 when the magnetically actuated valves 5 and 6 are in an open position and valve 7 closed, at a flow rate which insures that the gas mixture becomes saturated with iodine vapor. When the valves 5 and 6 are closed and valve 7 is open, the gas bypasses the iodine bed. The entire valve and iodine source bed arrangement is located in a thermostatically controlled oil bath. The temperature of the bath is determined by the desired vapor pressure of iodine and, for example, can be from room temperature to 180° C. The oil used in the bath is any temperature resistant oil such as silicone oil, transformer oil. For an iodine bed, 10 inches long and a 2-inch interior diameter, flows up to 2 liters per minute are usable. It is important to note that the minimum value of the partial pressure of hydrogen that may be employed must be greater than the equilibrium vapor pressure of the iodine source bed. This is necessary to insure complete conversion of the iodine emanating from the iodine source 4 to hydrogen iodide when the gas mixture is passed through the platinum wool catalyst chamber 8 maintained at between 300°–400° C. This chamber is 12 inches long times 1½ inches interior diameter and is packed with crumpled thermocouple grade 1 mil platinum wire. The effluent from this chamber consisting of hydrogen and/or helium, and hydrogen iodide is next carried into the polishing chamber 9 containing substrate single crystal wafers 10 of germanium or silicon. This chamber is maintained at the appropriate polishing temperature. The waste products are permitted to exit from the system at 11.

EXAMPLE I

A chemically polished circular single crystal Ge wafer 0.5 mm. thick and 1.39 cm.$^2$ area is heated in pure $H_2$ for 20 minutes at 890° C. in the polishing chamber. It is then treated with a $H_2$–HI gas mixture, the total pressure being 760 mm. and the partial pressure of HI being 70 mm. and the linear gas stream velocity being 700 cm. per minute at 890° C. for 5 minutes. The resultant wafer has lost .1 mm. in thickness, is mirror smooth, clean, damage free, and exhibits microscopic smoothness to better than 200 A. as determined by interferrometric tests.

EXAMPLE II

The process of Example I is repeated except that the etching temperature is 920° C. partial pressure of HI is 16.4 mm., carrier gas is comprised of a mixture of $H_2$ plus He where the molecular fraction of $H_2$ is .2, etching time, 15 minutes, linear gas stream velocity at temperature is 250 cm. per minute. The conclusion .08 mm. loss in thickness is observed and the surface is mirror smooth, clean, damage free and exhibits microscopic smoothness to better than 200 A. as determined by interferrometric tests.

EXAMPLES III–VII

The process of Example I is repeated except that the operating conditions and wafer surface pretreatment set forth in Table I below are used.

TABLE I

| Wafer Surface Pretreatment | Temp. (° C.) | HI Partial Pressure (mm. of Hg) | Total Pressure (mm. of Hg) | Gas | Linear Gas Velocity (cm. per minute) | Time (Minutes) | Amount Lost in Thickness (mm.) | Interferrometric Test, A. |
|---|---|---|---|---|---|---|---|---|
| Chemically polished | 910 | 16.4 | 760 | $H_2$ | 700 | 5 | .05 | 200 |
| Do | 910 | 45 | 760 | $H_2$ | 1,000 | 5 | .06 | 200 |
| Do | 920 | 16.4 | 760 | He | 250 | 15 | .1 | 200 |
| Lapped | 890 | 70 | 760 | $H_2$ | 700 | 10 | .25 | 200 |
| Mechanically polished | 890 | 70 | 760 | $H_2$ | 700 | 10 | .22 | 200 |

EXAMPLES VIII–XII

The process of Example I is repeated except that a silicon wafer is used, instead of a Ge wafer and the operating conditions and wafer surface pretreatment set forth in Table II are used.

TABLE II

| Wafer Surface Pretreatment | Temp. (° C.) | HI Partial Pressure (mm. of Hg) | Total Pressure (mm. of Hg) | Gas | Linear Gas Velocity (cm. per minute) | Time (Minutes) | Amount Lost in Thickness (mm.) | Interferrometric Test, A. |
|---|---|---|---|---|---|---|---|---|
| Lapped | 1,220 | 70 | 760 | $H_2$ | 1,000 | 30 | .1 | 400 |
| Mechanically polished | 1,220 | 70 | 760 | $H_2$ | 1,000 | 30 | .08 | 400 |
| Chemically polished | 1,220 | 70 | 760 | $H_2$ | 1,000 | 30 | .07 | 400 |
| Lapped | 1,220 | 70 | 760 | He | 1,000 | 30 | .2 | 400 |
| Do | 1,220 | 70 | 760 | (1) | 1,000 | 30 | .16 | 400 |

1 $He/H_2$ .2 mol fraction.

Thus, this invention describes a process for the vapor polishing of semiconductor surfaces to prepare clean, mirror smooth, damage free surfaces. This vapor polishing is accomplished by means of HI generated in situ and carried in pure $H_2$, He or mixtures thereof. These polished surfaces are used as substrates for subsequent epitaxial deposition of semiconductors.

While the invention has been particularly shown and described with reference to preferred embodiments thereof, it will be understood by those skilled in the art that the foregoing and other changes in form and details may be made therein without departing from the spirit and scope of the invention.

What is claimed is:

1. The method of vapor polishing the surface of a single crystal semiconductor wafer which has been subjected to one of the following treatments: (a) sawing (b) sawing and lapping (c) sawing, lapping and mechanically polishing (d) sawing, lapping and chemically polishing, said semiconductor being selected from the group consisting of germanium and silicon to eliminate the resulting surface imperfection and to obtain a clean, damage-free, mirror smooth surface comprising:
   subjecting said wafer to a flowing stream of hydrogen iodide and a carrier gas at a temperature in the range of 890° to 920° C. for germanium and at a temperature in the range of 1200° to 1300° C. for silicon.

2. The method of vapor polishing the surface of a single crystal semiconductor wafer according to claim 1 further including the step of:
   maintaining the hydrogen iodide at a predetermined partial pressure in the range of 1–150 mm. of mercury pressure to thereby polish the surface of said wafer.

3. The method of vapor polishing the surface of a single crystal semiconductor wafer according to claim 2 further including the step of:
   subjecting said wafer to a flowing gas stream of hydrogen iodide and a carrier gas at a linear gas stream velocity of 700 cm. per minute and up for germanium and of 1000 cm. per minute and up for silicon in which variation of etch rate with linear gas stream velocity is minimized.

4. The method of vapor polishing the surface of a single crystal semiconductor wafer said semiconductor being selected from the group consisting of germanium and silicon to obtain a clean, damage-free, mirror smooth surface comprising the step of:
   (a) subjecting the surface of the single crystal semiconductor wafer to a flowing gas stream of hydrogen iodide and a carrier gas, said hydrogen iodide having a partial pressure of 1–150 mm. of mercury pressure, at a linear gas stream velocity of 1–10,000 cm. per minute at a temperature of 890° C.–920° C. for germanium, and 1200° C.–1300° C. for silicon to thereby vapor polish said surface of the wafer and eliminate the formation of microscopic etch pits in said surface.

5. The method of claim 1 wherein the carrier gas is a gas selected from the group consisting of hydrogen and helium and mixtures thereof.

6. The method of vapor polishing the surface of a single crystal germanium wafer to obtain a clean, damage-free, mirror smooth surface comprising the steps of:
   (a) providing the surface of a single crystal germanium wafer;
   (b) subjecting the surface of the single crystal germanium wafer to a flowing gas stream of hydrogen iodide and a carrier gas, said hydrogen iodide having a partial pressure of 1–150 mm. of mercury pressure, at a linear gas stream velocity of 1–10,000 cm. per minute at a temperature of 890° C.–920° C. to thereby vapor polish said surface of the germanium wafer and eliminate formation of microscopic etch pits in said surface.

7. The method of claim 6 wherein the hydrogen iodide partial pressure is 16–70 mm. of mercury pressure, the linear gas stream velocity is 700 cm. per minute and the temperature is 910° C.

8. The method of claim 6 wherein the carrier gas is helium.

9. The method of claim 6 wherein the carrier gas is hydrogen.

10. The method of claim 6 wherein the carrier gas is a mixture of helium and hydrogen.

11. The method of vapor polishing the surface of a single crystal silicon wafer to obtain a clean, damage-free, mirror smooth surface comprising the step of:
   (a) providing the surface of a single crystal silicon wafer;
   (b) subjecting the surface of the single crystal silicon wafer to a flowing gas stream of hydrogen iodide and a carrier gas, said hydrogen iodide having a partial pressure of 1–150 mm. of mercury pressure, at a linear gas stream velocity of 1–10,000 cm. per minute at a temperature of 1200° C.–1300° C. to thereby vapor polish said surface of the silicon wafer and eliminate formation of microscopic etch pits in said surface.

12. The method of claim 11 wherein the hydrogen iodide partial pressure is 16–70 mm. of mercury pressure, the linear gas stream velocity is 1000 cm. per minute and the temperature is from 1220° C. to 1250° C.

13. The method of claim 11 wherein the carrier gas is helium.

14. The method of claim 11 wherein the carrier gas is hydrogen.

15. The method of claim 11 wherein the carrier gas is a mixture of helium and hydrogen.

References Cited

UNITED STATES PATENTS 3,030,189 4/1962 Schweickert et al. ---- 23—223.5
3,218,204 11/1965 Ruehrwein ---------- 148—175

JACOB H. STEINBERG, *Primary Examiner.*